(12) United States Patent
Murase

(10) Patent No.: US 7,119,556 B2
(45) Date of Patent: Oct. 10, 2006

(54) PROBE FOR SURFACE-RESISTIVITY MEASUREMENT AND METHOD FOR MEASURING SURFACE RESISTIVITY

(75) Inventor: Kiyoshi Murase, Saitama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/191,993

(22) Filed: Jul. 29, 2005

(65) Prior Publication Data

US 2006/0028216 A1  Feb. 9, 2006

(30) Foreign Application Priority Data

Jul. 29, 2004  (JP)  ............................ P2004-222149

(51) Int. Cl.
*G01R 27/08* (2006.01)

(52) U.S. Cl. ........................................ 324/724; 324/696

(58) Field of Classification Search ................ 324/724, 324/754, 696
See application file for complete search history.

(56) References Cited

U.S. PATENT DOCUMENTS 3,810,007 A * 5/1974 Wiseman et al. ............ 324/705

FOREIGN PATENT DOCUMENTS

JP  2000-304769 A  11/2000

* cited by examiner

*Primary Examiner*—Walter Benson
(74) *Attorney, Agent, or Firm*—Finnegan, Henderson, Farabow, Garrett & Dunner, L.L.P.

(57) ABSTRACT

A probe for surface-resistivity measurement is provided in a surface-resistivity measuring apparatus for measuring a surface resistivity of a target. The probe includes an electrode and a contact portion. The contact portion has a specific resistance larger than the electrode. The contact portion is disposed on the electrode. The contact portion is capable of surface-contact with the target.

6 Claims, 4 Drawing Sheets

RATIO OF COATING FILM 102: 90%

RATIO OF COATING FILM 102: 50%

RATIO OF COATING FILM 102: 10%

PROBE FOR SURFACE-RESISTIVITY MEASUREMENT AND METHOD FOR MEASURING SURFACE RESISTIVITY

This application is based upon and claims the benefit of priority from the prior Japanese Patent Application No. 2004-222149 filed on Jul. 29, 2004, the entire contents of which are incorporated herein by reference.

BACKGROUND OF THE INVENTION

1. Field of the Invention

The invention relates to a probe for surface-resistivity measurement provided in a surface resistivity meter for measuring surface resistivity of an object to be measured (hereinafter simply called an "object" or a "target"), as well as to a method for measuring surface resistivity with use of the probe for surface-resistivity measurement.

2. Description of the Related Art

Conductivity test of a printed circuit board is generally performed with use of a jig for testing conductivity of a substrate. A probe, which is to be brought into contact with a section to be tested of a printed circuit board, is disposed on the jig for testing conductivity of a substrate. As a probe to be disposed on the jig for testing conductivity of a substrate, there is known a probe configured such that, for the purpose of preventing damage, which may be otherwise inflicted on the section to be tested, the probe is brought into press-contact with the section to be tested, elastically and in a surface contact manner, thereby lowering contact pressure against the section to be tested (JP 2000-304769A (paragraphs 0014–0024)).

The probe includes a probe main body, and a contact member formed from a conductive rubber molded body disposed on a contact end, which is to be in contact with a section to be tested. The probe main body includes a coupling pin for fixing the contact member, a contact for retractably holding the coupling pin by means of a coil spring, and a socket for accommodating the contact. The conductive rubber molded body, which forms the contact member, is obtained by means of molding into a predetermined shape a material having been obtained through addition of a conductive powder material to a silicone resin.

BRIEF SUMMARY OF THE INVENTION

Meanwhile, measurement of surface resistivity is sometimes performed for inspection of a surface state (a forming state of a coating film, and the like) of an object to be measured. For such measurement, a resistivity meter provided with a probe having a pin-shaped electrode (having a sharp-pointed needle shape) has conventionally been employed. However, in such a resistivity meter, resistivity of a portion deeper than the surface of the object to be measured is measured in a state where the electrode of the probe is in contact with the object over an extremely small contact area (substantially a point). Accordingly, from a microscopic viewpoint, it is difficult to stably measure the surface resistivity of an object having a non-uniform surface condition.

More specifically, with regard to an object formed by covering a metal plate with a coating film for retarding corrosion, there may be a case where a coating film is not formed uniformly on metal. For instance, in connection with an object formed such that a region of the object covered with a coating film is higher in surface resistivity than another region of the object which is not coated with the coating film (i.e., a region where a metal plate is exposed), when a tip end of an electrode of a probe is in contact with the region coated with the coating film, a measured value varies greatly depending on the position of the probe and the state of the probe tip (slight differences in degree of abrasion, contact pressure, angle, and the like) on the assumption that an attempt is made to conduct measurement in such a way that a measured value becomes higher than actual surface resistivity (the average surface resistivity over the entire surface).

In addition, when surface resistivity of such an object to be measured that a coating film is formed non-uniformly on a metal is measured with use of a resistivity measurement device provided with a probe having a pin-shaped electrode, a problem of destroying the coating film also arises. Specifically, mechanical stress resulting from pressing a sharp-pointed probe onto a coating film destroys the coating film, whereby a resistivity value lower than an actual value is likely obtained. Furthermore, when, in an attempt to perform stable measurement, measurement is performed with a comparatively high voltage (about 10 V) and a comparatively high current (about tens of mA), the voltage and current also destroys or alters the coating film. Consequently, also in this case, a measurement value lower than that measured with a low voltage and low current is likely to be obtained.

The invention has been conceived in view of the above circumstances, and provides a probe for surface-resistivity measurement, which can stably measure surface resistivity of a target, as well as a method for measuring surface resistivity.

DETAILED DESCRIPTION OF THE EMBODIMENTS

Hereinbelow, a first embodiment of the invention will be described with reference to FIGS. 1 and 2.

Figure 1:
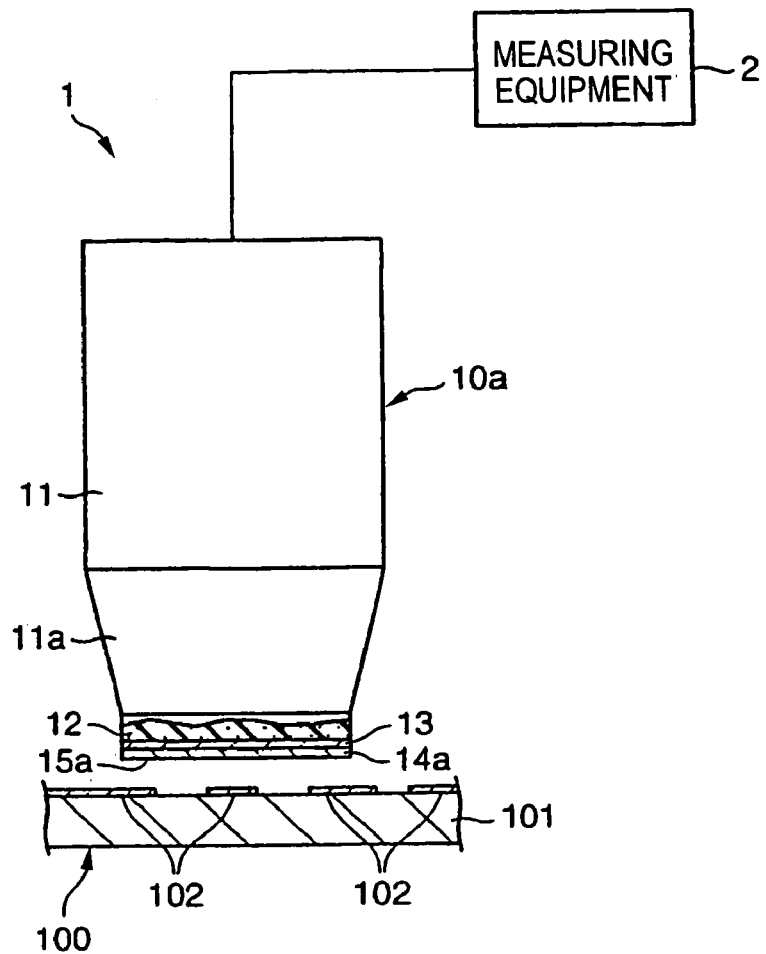
FIG. 1 is a partial cutaway side view showing a probe for surface-resistivity measurement according to a first embodiment of the invention.

FIG. 1 shows a surface resistivity meter 1. The surface resistivity meter 1 includes a measuring equipment 2, and a probe for surface-resistivity measurement (hereinafter, simply denoted as a "probe") 10a, which is electrically connected to the measuring equipment 2. In the descriptions, for convenience of explanation, a degree of resistance to electric flow between a conductive material being in contact with a surface of an object (target) to be measured and the inside of the object, or between two or more conductive materials being in contact with a surface of an object to be measured; that is, a degree of resistance to electric flow per unit area, is referred to as "surface resistivity." In addition, a "degree of ease of electric flow" can be obtained by means of converting a "degree of resistance to electric flow" into an inverse thereof.

The probe 10a includes a probe main body 11, a cushion portion 12, an electrode 13, and a contact portion 14a. The probe main body 11 has a block 11a that applies substantially uniform plane pressure onto the cushion portion 12. A tip face of the block 11a is formed flat. Disposed on the tip face of the block 11a is the cushion portion 12, which absorbs irregularities on the surface of an object to be measured (hereinafter called an "object" or "target") 100 and brings the contact portion 14a into surface contact with the object 100 with a stable plane pressure is. The cushion portion 12 is formed from an elastic material, such as rubber or sponge. A tip face of the cushion portion 12 is also formed flat. Meanwhile, the cushion portion 12 is not to rubber or sponge, but may be made of a desired material so long as the material is an elastic material.

A conductive film serving as the electrode 13, which measuring surface resistivity, is disposed on the tip face of the cushion portion 12.

A tip face of the electrode 13 is also formed flat. As the conductive film, a film made of a good conductor of low resistivity, such as metal foil of, for instance, copper, may be employed. The electrode 13 is electrically connected with the measuring equipment 2.

On the electrode 13, a resistive film, which serves as the contact portion 14a, formed from a material whose specific resistivity is higher than that of the electrode 13, is disposed. The contact portion 14a is for establishing electric connection between the object 100 and the electrode 13 with a predetermined electrical resistance. As the resistive film, a plastic film kneaded with a conductive material, such as carbon powder, may be employed. A tip face of the contact portion 14a is also formed flat. The tip face serves as a contact face 15a to be brought into contact with the object 100. The area of the contact face 15a is preferably 0.5 mm×0.5 mm or larger, further preferably 2.0 mm×2.0 mm or larger. In the present embodiment, the area of the contact face 15a is 5.0 mm×5.0 mm. Meanwhile, a shape of the contact face 15a is not limited to square, and can be of an arbitrary shape. In a case where the contact face 15a is formed into an arbitrary shape other than square, the contact face 15a is preferably formed into a size having an area corresponding to the above-mentioned area.

Meanwhile, a member, which has a resistive film and an adhesive layer laminated on the resistive film, maybe employed as the contact portion 14a. When the contact portion 14a is configured as above, the contact portion 14a can be easily disposed on the electrode 13 by means of merely affixing the resistive film to the conductive film by way of the adhesive layer.

Incidentally, a magnesium alloy 101 is known to have an electromagnetic shielding effect as well as being lightweight and having favorable strength. Accordingly, in recent years, attempts have been made to use the magnesium alloy 101 for a casing of an electronic device, such as a cellular phone or a portable computer, in place of a synthetic resin. However, since the magnesium alloy 101 is susceptible to corrosion, when the magnesium alloy 101 is employed for a casing of an electronic device or the like as described above, a coating film 102 for retarding corrosion must be formed on its surface. Therefore, when the magnesium alloy 101 is employed for a casing of an electronic device or the like, surface resistivity of a face on which the coating film 102 is formed is measured, thereby inspecting as to whether or not the coating film 102 is favorably formed on the magnesium alloy 101, which serves as a base member.

Figure 2:
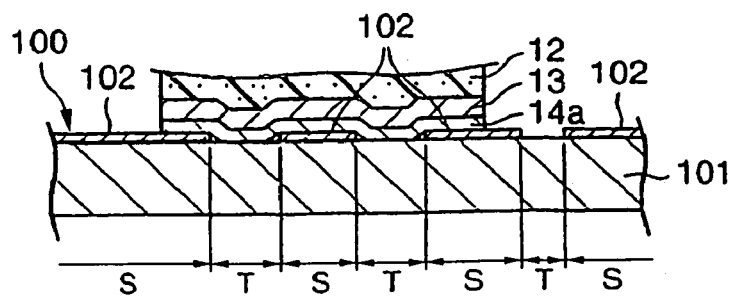
FIG. 2 is a sectional view showing a state in which a tip of the probe shown in FIG. 1 is pressed against an object (target) to be measured.

However, it is difficult to form the coating film on the magnesium alloy 101 uniformly, and a region S where the coating film 102 is formed and a region T where the coating film 102 is not formed are likely to be formed in a dappled manner (see FIG. 2). Accordingly, when surface resistivity of the object 100, which is configured such that the coating film 102 is formed on the magnesium alloy 101, is measured with use of the related-art probe having a pin-shaped electrode, the following problem arises. That is, in a case where a tip of an electrode of the related-art probe is in contact with the region S where the coating film 102 is formed, a measured value higher than actual surface resistivity (the average surface resistivity over the entire surface) is obtained; and in a case where the same is in contact with the region T where the coating film 102 is not formed, a measured value lower than actual surface resistivity (the average surface resistivity over the entire surface) is obtained. Therefore, the related-art probe encounters difficulty in performing accurate inspection as to whether or not the coating film 102 is formed on the magnesium alloy 101, which serves as a base member.

In contrast, the probe 10a of the present embodiment is capable of measuring surface resistivity of the object 100 stably, even when the object 100 is configured such that the coating film 102 is formed on the surface of the magnesium alloy 101, or the like.

Hereinbelow, a method for measuring surface resistivity with use of the probe 10a of the present embodiment will be described with reference to an example method for measuring surface resistivity of the object 100, which is configured such that the coating film 102 is applied on the surface of a plate material formed of the magnesium alloy 101.

In a state where the probe main body 11 is held, the flat contact face 15a of the contact portion 14a of the probe 10a is pressed onto the surface of the magnesium alloy 101 on which the coating film 102 is applied. As a result of this operation, substantially uniform plane pressure can be applied on an upper face of the cushion portion 12 by way of the block 11a. Hence, the cushion portion 12 is elastically deformed while absorbing irregularities on the surface of the object 100; and, simultaneously, the cushion portion 12 applies a substantially uniform pressing force onto the contact face 15a of the contact portion 14a. As shown in FIG. 2, this pressing force causes the contact portion 14a to be elastically deformed, thereby bringing the contact face 15a of the contact portion 14a into surface contact with the object 100. Therefore, even when the region S where the coating film 102 is formed and the region T where the coating film 102 is not formed are present in a drappled state, a value fairly close to the actual surface resistivity or a value, which is proportional to the actual surface resistivity, can be obtained.

The related-art probe having a pin-shaped electrode may damage the surface of the object 100 during measurement. Once the surface of the object 100 is damaged, it is difficult to recover the damage. Therefore, when the object 100 is to be applied to a casing of an electronic device, or the like, its value as a product drops. In contrast, according to the probe 10a of this embodiment, the contact portion 14a is brought into surface contact with the surface of the object 100 while being elastically deformed. Accordingly, the surface of the object 100 is less likely to be damaged during measurement.

Meanwhile, when the electrode 13 is exposed or when the contact portion 14a is a good conductor, current flows through the electrode 13 or through the good conductor of the contact portion 14a in a direction parallel with the object face. As a result, influence of the coating film 102 is masked, and a measured value lower than the actual surface resistivity (the average surface resistivity over the entire surface) is obtained. Hence, by means of bringing the contact portion 14a into surface contact with the object 100, a value fairly close to the actual surface resistivity (the average surface resistivity over the entire surface) or a value corresponding to the actual surface resistivity can be obtained (away in which the value corresponds the actual surface resistivity depends on specific resistivity of the contact portion 14a).

Hereinbelow, a relationship between a ratio of the area where the coating film 102 is formed to total surface area and measured resistivity will be described with reference to an example model. In the model, results of measurement of surface resistivity obtained with use of the related-art probe having a pin-shaped electrode and those obtained with use of the probe 10a of the embodiment are schematically compared.

In the model, in a case where the related-art probe having a pin-shaped electrode is used, the number of contact portions is assumed to be one. Under such an assumption, with regard to the probe 10a of the embodiment which is configured such that the contact portion 14a having specific resistivity higher than that of the electrode 13 comes into surface contact with the object 100, the electrode 13 can be considered to come into contact with the object 100 at plural portions by way of the contact portion 14a. In this model, in the case where the probe 10a of the embodiment is used, the number of contact portions is assumed to be ten. In addition, it is assumed that electrical resistance of the magnesium alloy 101 is 0 Ω, that resistance per contact portion is 10 Ω, that the coating film 102 is an insulating film, and that resistance of a measurement lead between the electrode 13 and the measuring equipment 2 is neglected.

Figure 7A:
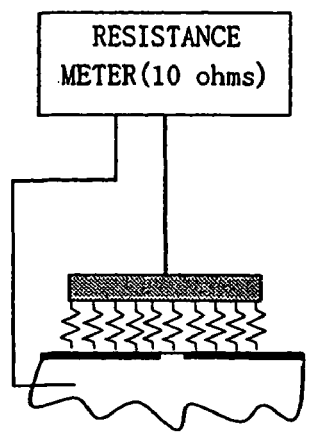
FIG. 7 is a schematic diagram explaining a relationship between a ratio of an area where a coating film 102 is formed to total surface area and measured resistivity.

A case where 90% of the surface of the magnesium alloy 101 is covered with the coating film 102 as shown in FIG. 7A will be described. The probe having a pin-shaped electrode obtains a measured value of 10 Ω with 10% probability and obtains a measured value of 0 Ω with 90% probability. In contrast, in the probe 10a of the embodiment, one portion of the ten contact portions is brought into contact with the region T where the magnesium alloy 101 is exposed. That is, since one portion of the ten contact portions is brought into conduction, a measured value of 10 Ω is obtained.

Figure 7B:
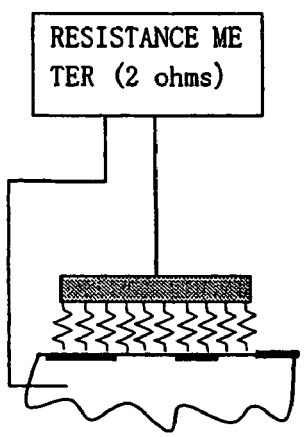

A case where 50% of the surface of the magnesium alloy 101 is covered with the coating film 102 as shown in FIG. 7B will be described. The probe having a pin-shaped electrode obtains a measured value of 10 Ω with 50% probability, obtains a measured value of 0 Ω with 50% probability. In contrast, in the probe 10a of the embodiment, five portions of the ten contact portions are brought into contact with the region T where the magnesium alloy 101 is exposed. That is, five portions of the ten contact portions are brought into conduction. This corresponds to a combined resistance (2 Ω) of a case where five resistors of 10 Ω are connected in parallel, thereby obtaining a measured value of 2 Ω.

Figure 7C:
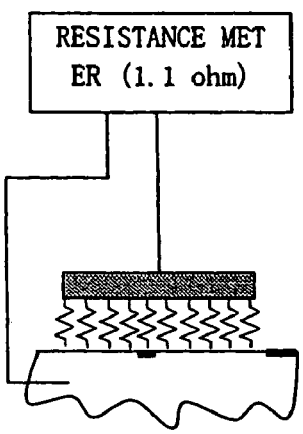

A case where 10% of the surface of the magnesium alloy 101 is covered with the coating film 102 as shown in FIG. 7C will be described. The probe having a pin-shaped electrode obtains a measured value of 10 Ω with 90% probability, and obtains a measured value of 0 Ω with 10% probability. In contrast, in the probe 10a of the embodiment, nine portions of the ten contact portions are brought into contact with the region T where the magnesium alloy 101 is exposed. That is, nine portions of the ten contact portions are brought into conduction. This corresponds to a combined resistance (1.1 Ω) of a case where nine resistors of 10 Ω are connected in parallel, thereby obtaining a measured value of 1.1 Ω.

As described above, measurement of surface resistivity with use of the probe 10a of the present embodiment can obtain a ratio of an area having superior electrical conductivity to the total surface of the object 100, or the level of ease of electric conduction achieved at the surface of the object 100 under measurement.

Measurement of surface resistivity with use of the probe 10a of the present embodiment also can check the surface state of the object 100 having, e.g., a surface coated with an oxide film or a surface to which dust or oil adheres (i.e., a ratio of the area where the oxide film is formed to the total surface, the extent of adhesion of dust or oil, or the like).

As described above, the probe 10a of the present embodiment has, on the electrode 13, the contact portion 14a having specific resistivity higher than that of the electrode 13, and is capable of making surface contact with the object 100. Accordingly, it is possible to make good and stable measurement of surface resistivity of the object 100 even when the surface state of the object 100 is non-uniform on a microscopic level, or when the object 100 has such a surface on which an oxide film is formed, or dust or the like is present thereon. Thus, by means of applying the probe 10a of the present embodiment, favorable inspection of the surface states of a variety of objects 100 can be attained.

Furthermore, in the probe 10a of the present embodiment, the contact portion 14a is elastically deformable so as to be in surface-contact with the object 100. Therefore, the contact portion 14a can be brought into surface contact with the object 100 without causing a load to concentrate on one portion on the object 100. Accordingly, stable measurement of surface resistivity of the object 100 can be attained while damage, which may be otherwise be inflicted on the object 100 during measurement, can be suppressed.

Furthermore, since the contact portion 14a of the probe 10a of the present embodiment has a flat face, the contact portion 14a can be brought into favorable surface contact with the object 100 during measurement of surface resistivity of a plate-like object 100.

In addition, according to the method for measuring surface resistivity of the present embodiment, surface resistivity of the object 100 is measured with use of the probe 10a, which has, on the electrode 13, the contact portion 14a having specific resistivity higher than that of the electrode 13 and is capable of making surface contact with the object 100. Therefore, stable measurement of surface resistivity of the object 100 can be attained.

Moreover, according to the method for measuring surface resistivity of the present embodiment, large electric current, which allows current to flow between the adjacent regions T (regions where a metal plate are exposed) is not required. More specifically, measurement of surface resistivity of the object 100 can be attained with a comparatively low level of current (current weaker than that has been used in the related art).

Figure 3:
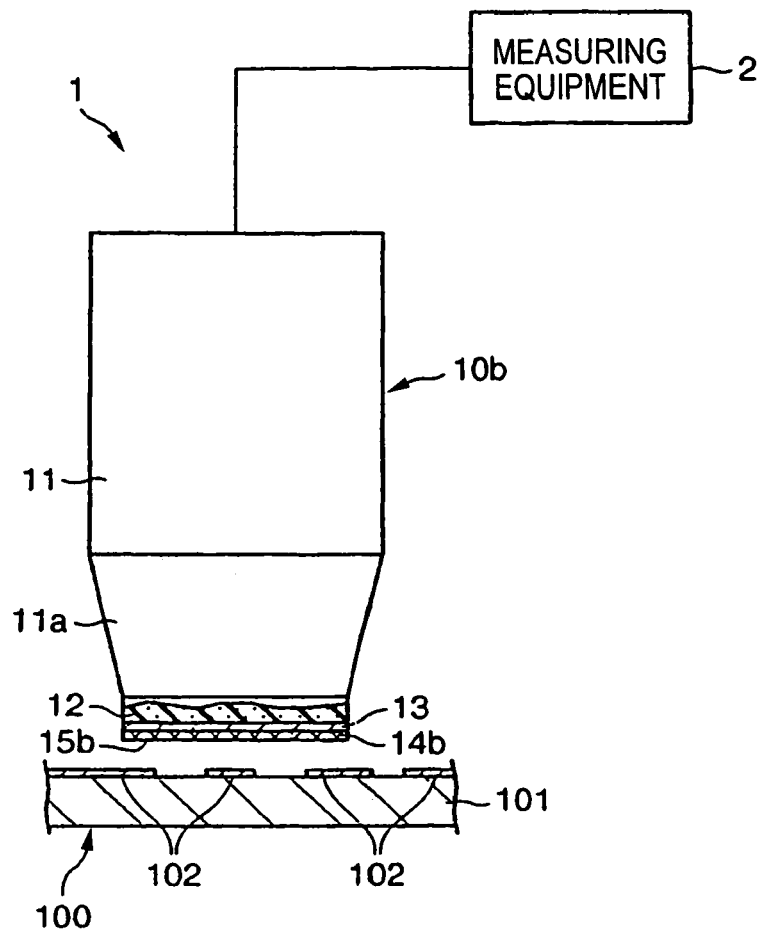
FIG. 3 is a partial cutaway side view showing a probe for surface-resistivity measurement according to a second embodiment of the invention.

Hereinbelow, a second embodiment of the invention will be described with reference to FIG. 3.

A probe for surface-resistivity measurement (hereinafter, simply denoted as a "probe") 10b of the present embodiment has a contact portion 14b formed of conductive fiber in place of the contact portion 14a formed of a plastic thin plate containing carbon. Meanwhile, at least a portion of the contact portion 14b, which is to be brought into contact with the object 100, should be formed of a fiber-like material. More specifically, there may be employed an element having a cloth formed of conductive fiber and an adhesive layer laminated on the cloth, as the contact portion 14b. When the contact portion 14b is configured as above, the contact portion 14b can be easily disposed on the electrode 13 by means of merely affixing the cloth formed pf the conductive fiber to the conductive film by way of the adhesive layer. Meanwhile, in other respects, the second embodiment is identical with the previously mentioned first embodiment. Therefore, the same reference numerals are denoted in the drawing, and repeated descriptions thereof will be omitted.

The probe 10b of the present embodiment is configured such that the contact portion 14b has plural fibers on the entire surface of a contact face 15b. These plural fibers change their shapes flexibly in conformity with irregularities of the surface of the object 100. Hence, even when the object 100 has irregularities on its surface, the contact portion 14b of the probe 10b can be brought into surface contact with the object 100 (surface contact over a sum of contact areas of the plural fibers). Accordingly, the probe 10b of the present embodiment can achieve the same effect as that achieved by the probe 10a of the first embodiment.

Hereinbelow, a third embodiment of the invention will be described with reference to FIGS. 4 to 6.

Figure 4:
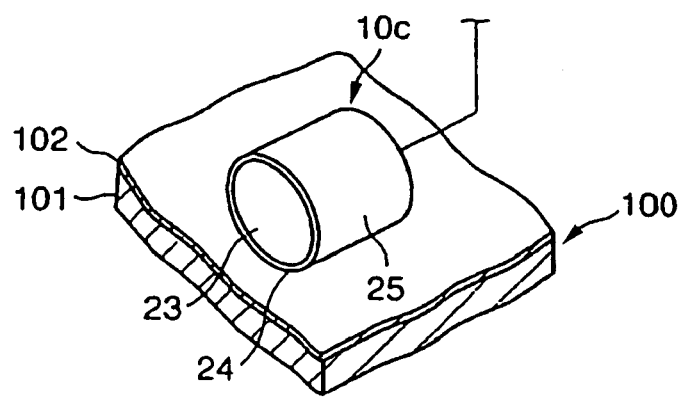
FIG. 4 is a perspective view showing a probe for surface-resistivity measurement according to a third embodiment of the invention.
Figure 5:
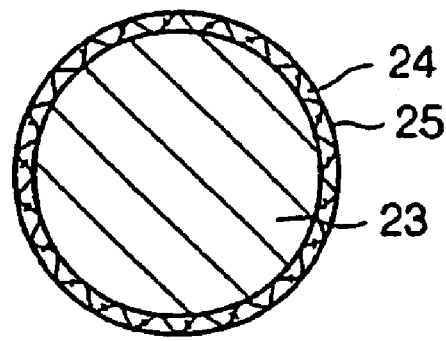
FIG. 5 is a sectional view showing the probe shown in FIG. 4.

As shown in FIGS. 4 and 5, a probe for surface-resistivity measurement (hereinafter, simply denoted a "probe") 10c of the present embodiment has a columnar electrode 23 and a contact portion 24 disposed so as to cover the periphery of the electrode 24. The electrode 23 may be formed of, for instance, copper. The electrode 23 serves three functions: as a retention portion for maintaining the shape of the probe 10c; as a weight portion for applying a constant pressure on the contact portion 24, thereby bringing the contact portion 24 into surface contact with a stable plane pressure; and as an electrode for measuring surface resistivity. In addition, the electrode 23 is electrically connected with the measuring equipment 2 (illustration is omitted in FIG. 4).

The contact portion 24 is constituted of a cloth formed of a material, such as conductive fiber, having specific resistivity higher than that of the electrode 23. A periphery of the contact portion 24 serves as a contact face 25. Meanwhile, the contact portion 24 may be formed such that a material having been obtained by means of laminating an adhesive layer on a cloth formed of conductive fiber is wrapped around the columnar electrode 23 plural times. In this case, the contact portion 24 has a multilayered structure in which a layer constituted of the conductive fiber and the adhesive layer are alternately laminated.

Figure 6:
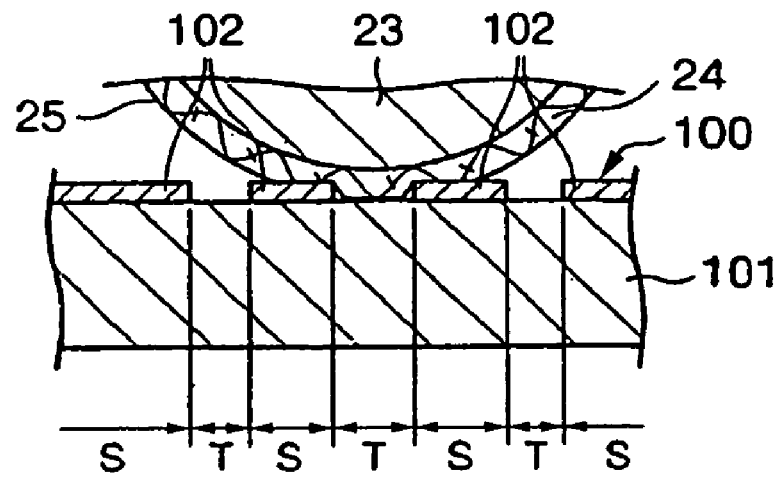
FIG. 6 is a sectional view showing a state where a portion of the probe shown in FIG. 4 is pressed against an object to be measured.

As shown in FIG. 6, when the probe 10c of the present embodiment is placed on the object 100, its own weight (i.e., a weight of the electrode 23) brings the probe 10c to into surface contact with the object 100 while causing a portion of the contact section 14 to be elastically deformed. Accordingly, the probe 10c of the present embodiment can achieve the same effect as that achieved by the probe 10a in the first embodiment.

Meanwhile, in the probe 10c of the third embodiment, the electrode 23 is formed into a columnar shape. However, even when the electrode 23 is formed into a cylindrical or a spherical shape, the same effect can be achieved.

In the second and third embodiments, an element, which is configured such that at least a portion thereof to be brought into contact with the object 100 is formed of a fiber-like material, is employed as the contact portion 14b, 24. However, a member constituted such that plural conductive coil springs are disposed on at least a portion to be brought into contact with the object 100 may be employed as the contact portion 14b, 24. Alternatively, a cloth whose surface is coated with a conductive material may be employed as the contact portion 14b, 24.

What is claimed is:

1. A probe for surface-resistivity measurement, provided with a surface-resistivity measuring apparatus for measuring a surface resistivity of a target, the probe comprising:
   a probe main body;
   a cushion portion disposed on the probe main body, the cushion portion made of an elastic body;
   an electrode disposed on the cushion portion; and
   a contact portion that has a specific resistance larger than the electrode, the contact portion being disposed on the electrode, the electrode being located between the cushion portion and the contact portion, the contact portion being capable of surface-contact with the target.

2. The probe according to claim 1, wherein the contact portion is elastically deformable to surface-contact with the target.

3. The probe according to claim 1, wherein a part of the contact portion surface-contacting with the target is made of a fibrous material.

4. The probe according to claim 1, wherein the contact portion includes a flat contact surface contacting with the target.

5. The probe according to claim 4, wherein an area of the flat contact surface is equal to or larger than 0.25 mm$^2$.

6. A method for measuring a surface resistivity of a target, the method comprising:
   bringing a contact portion of a probe into surface-contact with the target to measure the surface resistivity of the target, the probe comprising:
   a probe main body;
   a cushion portion disposed on the probe main body, the cushion portion made of an elastic body;
   an electrode disposed on the cushion portion; and
   a contact portion that has a specific resistance larger than the electrode, the contact portion being disposed on the electrode, the electrode being located between the cushion portion and the contact portion.

* * * * *